United States Patent [19]

Lewis

[11] 4,114,010

[45] Sep. 12, 1978

[54] TEST CIRCUIT AND METHOD FOR MATCHING AN INDUCTION LOAD TO A SOLID STATE POWER SUPPLY

[75] Inventor: John C. Lewis, Wentworth, Canada

[73] Assignee: Park-Ohio Industries, Inc., Cleveland, Ohio

[21] Appl. No.: 835,157

[22] Filed: Sep. 21, 1977

Related U.S. Application Data

[63] Continuation of Ser. No. 668,952, Mar. 22, 1976, abandoned.

[51] Int. Cl.² .............................................. H05B 5/04
[52] U.S. Cl. ............................. 219/10.41; 219/10.77
[58] Field of Search .................. 219/10.41, 6.5, 10.75, 219/10.77

[56] References Cited

U.S. PATENT DOCUMENTS

| | | | |
|---|---|---|---|
| 2,470,443 | 5/1949 | Mittelmann | 219/10.77 |
| 2,498,760 | 2/1950 | Kreithen | 219/10.77 |
| 2,858,406 | 10/1958 | Boyd et al. | 219/10.75 |
| 3,419,792 | 12/1968 | Kasper et al. | 219/10.77 |
| 3,475,674 | 10/1969 | Porterfield et al. | 219/10.75 |

*Primary Examiner*—Bruce A. Reynolds
*Attorney, Agent, or Firm*—Meyer, Tilberry & Body

[57] ABSTRACT

An auxiliary electrical test circuit is provided which is adapted to assist in matching the resonant frequency of an induction heating load with the rated frequency range of a solid state high frequency power source coupled to the load circuit. The load circuit includes an inductor, power factor correction capacitors, and a given workpiece to be inductively heated. The test circuit includes an audio frequency oscillator of low output power having an output frequency which may be adjusted in a range extending below and above the rated frequency range of the solid state power source. The oscillator output is coupled to the load circuit independent of the solid state power source, and the output frequency of the oscillator is adjusted to coincide with the resonant frequency of the load circuit, which coincidence is determined by observing the peak voltage obtained during adjustment of the oscillator output frequency. The oscillator frequency is then compared to the rated frequency range for the solid state power supply. If the resonant frequency of the load circuit is outside the rated frequency range for the solid state power supply, power factor correction capacitors are added or subtracted until the load circuit frequency is determined to be within the rated frequency range of the power supply.

9 Claims, 3 Drawing Figures

TEST CIRCUIT AND METHOD FOR MATCHING AN INDUCTION LOAD TO A SOLID STATE POWER SUPPLY

This is a continuation division of application Ser. No. 668,952 filed Feb. 22, 1976 abandoned.

The present invention relates to the art of induction heating equipment and, more particularly, to an auxiliary test circuit and method for matching an induction heating load with a solid state power supply for the load circuit of induction heating equipment.

Induction heating apparatus has been used for many years in various industrial applications. Such apparatus generally includes an inductor surrounding or adjacent to a workpiece to be heated, and a power supply for passing an alternating current through the inductor to induce circulating heating currents in the workpiece. In the past, motor-generator sets and electronic oscillators have been employed extensively as power supplies. More recently, the advent of various solid state electronic devices has led to the development of solid state power supplies for introducing an altenating current into the inductor of an induction heating installation. Among such solid state power supplies, for example, are inverters which convert direct current into an alternating output. The present invention will be discussed in conjunction with such a solid state inverter power supply, but it will be readily appreciated that the invention is applicable to induction heating equipment powered by other solid state power supply arrangements.

In conjunction with the use of a given induction heating installation, a change in workpieces to be heated, in successive jobs for example, often results in a change in the induction heating load as defined by the inductor, the workpiece to be inductively heated, and power factor correcting capacitors associated with the inductor. Such a change in the induction heating load results in a change in the resonant frequency of the load circuit and a workpiece inductively coupled with the inductor thereof. Solid state high frequency power sources used for induction heating applications will not operate if the resonant frequency of the load circuit and workpiece does not closely approximate the rated output frequency of the power source. More particularly, if the resonant frequency of the load circuit and a workpiece inductively coupled with the inductor thereof is either above or below the rated output frequency of the solid state power supply, the change in resistance in the load circuit caused by the workpiece change results in a voltage change in the power supply circuit and kick-off or inoperation of the solid state power supply. Accordingly, it becomes desirable to provide for matching the resonant frequency of the induction heating load as defined by the load circuit and workpiece with the rated output frequency of the power supply.

Such matching is achieved in accordance with the present invention by means of an auxiliary test circuit coupled with the load circuit independent of the solid state power supply. The test circuit includes an audio frequency oscillator having an output frequency which is adjustable in a range both above and below the rated output frequency for the solid state power supply. By adjusting the output frequency of the oscillator over its range of operation, and measuring the voltage across the output of the oscillator during such adjustments, a peak voltage will be developed somewhere between the limits of the oscillator output frequency. This peak voltage occurs due to the increase in impedance at the resonant frequency of the load circuit and workpiece and, accordingly, the oscillator output frequency at this point corresponds to the resonant frequency of the load circuit and workpiece. Therefore, this oscillator output frequency can be compared with the rated output frequency of the solid state power supply in order to determine whether the resonant frequency of the load circuit and workpiece approximates the rated output frequency of the power supply. If the resonant frequency is outside the limits of operation of the solid state device, power factor correction capacitors in the load circuit can be added or subtracted as is necessary until the testing shows that the resonant frequency of the load circuit and workpiece is within acceptable limits.

It will be appreciated therefore that the present invention advantageously enables matching the frequency of the load circuit and a given workpiece with the rated frequency of a solid state power supply for the load circuit, thus to minimize the time and effort required to enable use of solid state powered induction heating equipment for jobs providing a change in the induction heating load as a result in differences in workpieces to be heated. Additionally, necessary adjustments of the load circuit can readily be made without endangering the solid state power supply equipment which might result from attempted adjustments followed by energization of the power supply to determine whether or not the latter will operate with the blind adjustments.

The load circuit for induction heating equipment often includes a variable ratio transformer having a primary winding connected to the power source and a secondary winding connected to the inductor. In connection with such a variable ratio transformer arrangement, the test circuit of the present invention advantageously enables obtaining an impedance match in the load circuit as well as a frequency match between the load circuit and power supply. In this respect, for any given number of power factor correction capacitors in a load circuit there is a voltage known to be indicative of optimum impedance balance. Therefore, the voltmeter connected across the output of the audio frequency oscillator can be calibrated to give an indication of a voltage reading corresponding to an optimum impedance match for a given number of capacitors. Then, by varying the transformer ratio, various voltage readings are obtained for comparison with the voltage indicated for optimum impedance matching. The transformer ratio providing the voltage closest to the calibrated voltage is the transformer ratio which will provide the best impedance match for the number of capacitors which are in the load circuit following the frequency matching operation.

Preferably, the oscillator is an audio frequency oscillator of low output power within the range of about 20 to 25 watts. This range enables testing in connection with a solid state power supply in the range of 1-10 kHz. Further, the test circuit preferably is associated with the solid state power supply and load circuit through a switch arrangement which alternately connects one of the power supply and test circuit to the load circuit and disconnects the other from the load circuit. The test equipment is inexpensive, small in size and simple to construct and can readily be built into a cabinet generally provided with induction heating equipment to house the power supply and load circuit components. The test circuit would of course be an extremely useful aid in connection with an induction heating station at which frequent job changes are encountered.

It is accordingly an outstanding object of the present invention to provide a method and test circuit to assist in matching the resonant frequency of a load circuit and workpiece in an induction heating installation with the rated output frequency of a solid state power supply for the load circuit.

A further object is the provision of a method and test circuit of the foregoing character which minimizes the time and effort involved in adjusting solid state powered induction heating equipment for induction heating load changes resulting from different workpieces to be heated.

Another object is the provision of a method and test circuit of the foregoing character which enables the efficient and accurate matching of the resonant frequency of a load circuit and workpiece with the rated frequency of the solid state power supply.

Still another object is the provision of a method and test circuit of the foregoing character which enables impedance matching in the load circuit following the frequency matching.

Yet another object is the provision of an auxiliary test circuit of the foregoing character which is adapted to be readily and selectively connected and disconnected to the load circuit of induction heating equipment.

Still a further object is the provision of an auxiliary test circuit of the foregoing character which is inexpensive, compact in size and simple to construct and operate.

The foregoing objects, and others, will in part be obvious and in part pointed out more fully hereinafter in conjunction with the written description of a preferred embodiment of the invention as illustrated in the accompanying drawings in which.

Figure 1:
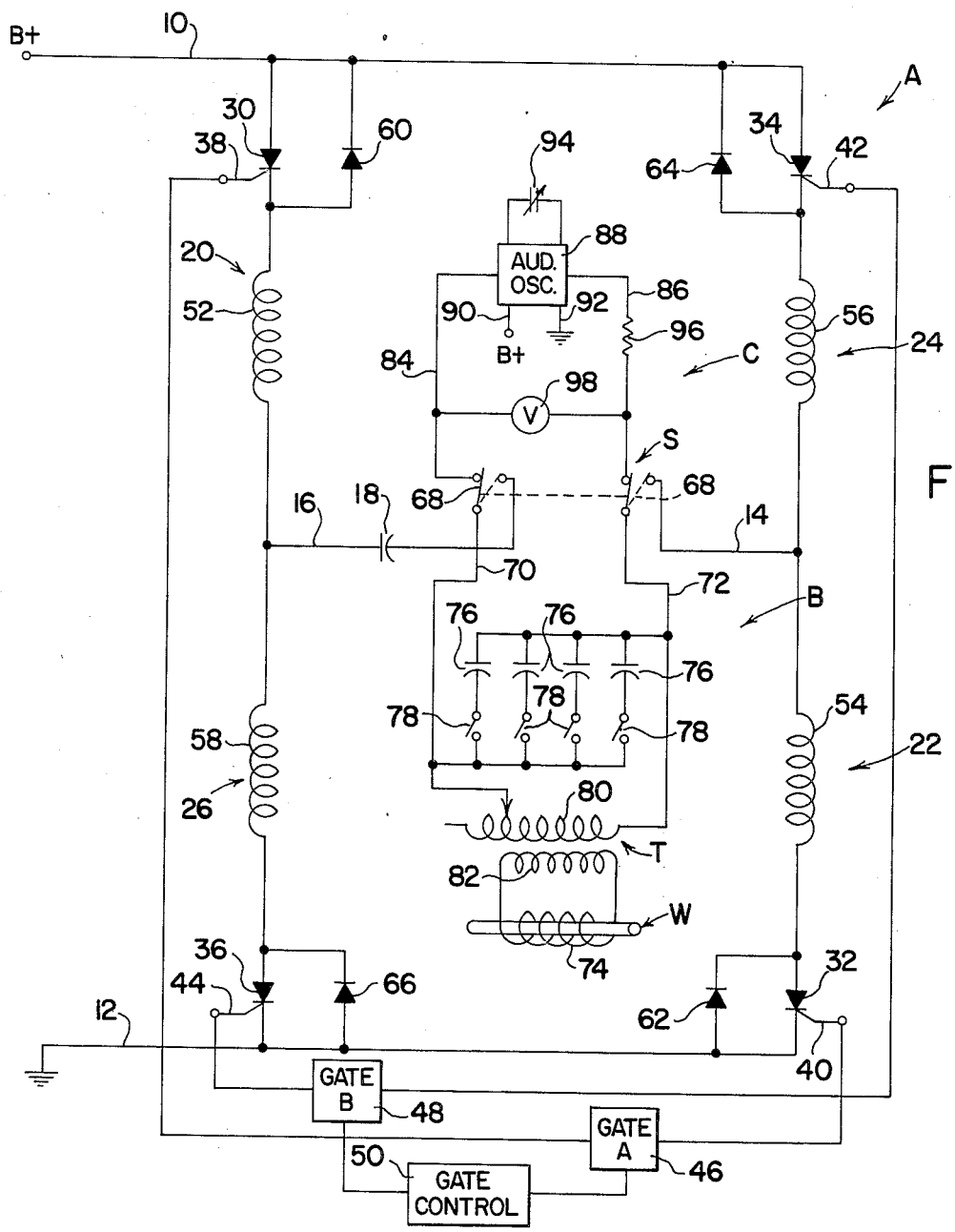
FIG. 1 is a schematic circuit diagram showing the test circuit of the present invention in conjunction with a solid state inverter type power supply.

Referring now in greater detail to the drawings wherein the showings are for the purpose of illustrating a preferred embodiment of the invention only and not for the purpose of limiting the same, FIG. 1 shows a resonant bridge inverter A having an output connectable to an induction heating load circuit B, and a test circuit C according to the present invention which is connectable to load circuit B as described hereinafter. In the embodiment shown, inverter A includes leads 10 and 12 adapted to be connected across a DC power supply, not shown. The inverter further includes a bridge branch including leads 14 and 16 and a commutating capacitor 18, first and second bridge legs 20 and 22, and third and fourth bridge legs 24 and 26. Silicon controlled rectifiers 30, 32, 34 and 36, hereinafter referred to as SCR's are positioned in a forward biased relationship in the various bridge legs and include corresponding gates 38, 40, 42 and 44. Gating signals for SCR's 30 and 32 are provided by a gating device 46 having a conventional construction, and the gating signals for SCR's 34 and 36 are provided by a gating device 48. The sequence of operation of the gating devices 46 and 48 is controlled by an appropriate gate control device 50. In the embodiment shown, bridge legs 20, 22, 24 and 26 further include corresponding inductances 52, 54, 56 and 58. Additionally, SCR's 30, 32, 34 and 36 have corresponding shunting diodes 60, 62, 64 and 66 associated therewith and connected in opposite sense to the corresponding SCR so that current will flow through the diodes in a direction opposite to current flow through the SCR.

In a manner which is well known, inverter A operates to convert direct current applied across leads 10 and 12 into an alternating output for connection to an induction heating load connected in the bridge branch. More particularly, in the embodiment shown, gating of SCR's 30 and 32 renders bridge legs 20 and 22 conductive in one direction whereby current flows through the legs and the central bridge branch in the one direction, and gating of SCR's 34 and 36 renders legs 24 and 26 conductive in the opposite direction whereby current flows through the legs and central bridge branch in the opposite direction. When the current attempts to flow in a direction reverse to the forward direction of each pair of SCR's, the current flows through the corresponding shunting diodes. This reverse current commutates or turns "off" the SCR's and blocks further flow of current through the SCR's until they are subsequently gated "on". By controlling the SCR's one set is "on" while the other is "off". This creates a generally sinusoidal wave in the central bridge branch of the inverter, and by connecting the bridge branch with an induction heating load circuit, an alternating current is imposed upon the load circuit.

As will be seen in FIG. 1, the central bridge branch of inverter A is adapted to be connected to induction heating load circuit B by means of a double pole switch S. When the switch contacts 68 of switch S are in the broken line positions shown in FIG. 1, bridge leads 14 and 16 of inverter A are electrically connected to leads 70 and 72 of load circuit B, whereby the alternating current outut of the inverter is imposed on the load circuit. In the embodiment shown, load circuit B is comprised of an inductor in the form of a coil 74 and a number of power factor correction capacitors 76 connected across leads 70 and 72 in parallel with inductor 74. Each capacitor 76 is connected in series with a corresponding switch 78 which enables varying the capacitance in the load circuit for purposes of tuning the circuit. In the embodiment shown, inductor 74 is adapted to be energized through a variable ratio turn transformer T having a tapped primary winding 80 connected across leads 70 and 72, and a secondary winding 82 connected to the opposite ends of inductor coil 74. While the inductor is shown as a coil, it will be appreciated that the inductor can be of any desired structure.

It will be appreciated, of course, that inductor coil 74 is adapted to receive and be inductively coupled with a workpiece W to be heated. In changing from one induction heating job to another which involves a change in specifications for the workpiece, the resonant frequency of load circuit B with the new workpiece inductively coupled with the inductor may change due to the change in resistance caused by the new workpiece. If the resonant frequency of the load circuit and a new workpiece associated with the inductor does not closely approximate the rated output frequency of the inverter, the inverter simply will not operate. Accordingly, adjustments in the load circuit are necessary in order to match the resonant frequency thereof with the new workpiece inductively coupled with the inductor with the rated output frequency of the inverter.

Such matching is readily and simply achieved in accordance with the present invention by means of test circuit C which is adapted to be selectively coupled with load circuit B through switch S. More particularly, as will be seen from FIG. 1, test circuit C includes a pair of leads 84 and 86 adapted to be electrically connected respectively with leads 70 and 72 of load circuit B when contacts 68 of switch S are in the solid line positions shown. It will be noted too that the latter position of contacts 68 of switch S disables inverter A with respect to supplying power to load circuit B.

Test circuit C is comprised of an audio frequency oscillator 88 adapted to be connected by leads 90 and 92 to a suitable source of direct current, not illustrated, and having an output through leads 84 and 86. Oscillator 88 is of low output power and has a variable frequency output, preferably adjustable over the range thereof by means of a variable capacitor 94. While a variable capacitor is shown for the purpose of adjusting the output frequency of the oscillator, it will be appreciated that the output frequency could be otherwise adjusted such as by an inductor or similar device. The output frequency of the oscillator has a range which extends both above and below the rated frequency of the power source. The oscillator output is coupled to load circuit B through a suitable resistor 96 in lead 86, and a sensitive voltmeter 98 is connected across leads 84 and 86 for the purpose set forth hereinafter.

In use of test circuit C, switch S is actuated to disable inverter A and connect the test circuit to load circuit B. A workpiece to be heated is positioned in inductively coupled relationship with inductor 74, and oscillator 88 is energized for the output thereof to be imposed on the load circuit. The output frequency of oscillator 88 is then varied over the scanning range thereof by adjustment of capacitor 94. As the oscillator frequency is varied over the scanning range, a point will be reached where the output frequency of the oscillator coincides with the resonant frequency of the load circuit and workpiece. At this point, a marked increase will occur in the voltage and this increase is detected by observing voltmeter 98. This marked increase in voltage, or peaking of the voltage, is due to the increase in impedance at the resonant frequency of the load circuit and workpiece.

Figure 2:
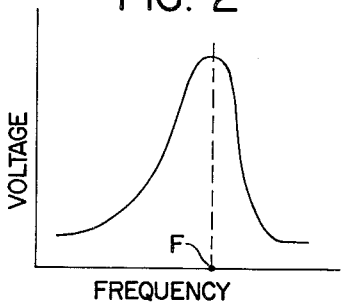
FIG. 2 is a graph illustrating a peak voltage reading during use of the test circuit in frequency matching; and, FIG. 3 is a graph illustrating various voltage reading relationships in connection with use of the test circuit to achieve impedance matching.

Such a peak voltage is graphically illustrated in FIG. 2, and the frequency of the oscillator at which the peak voltage is observed is indicated on the graph by point F. This frequency can of course be determined by observing the setting of the variable capacitor and is compared with the rated output frequency of the inverter. If the frequency of the load circuit and workpiece is outside the limits of operation of the solid state power supply, then additions or subtractions of power factor correcting capacitors 76 are then made through corresponding switches 78 until the resonant frequency in the load circuit is determined to be within acceptable limits for operation of the inverter. It will be appreciated that a simple calculating device could be devised to provide output information relating to capacitors to be added or capacitors to be subtracted in response to input information regarding the rated frequency of the power supply and the observed frequency from the oscillator.

Figure 3:
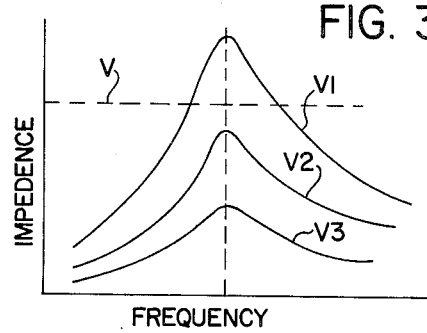

In addition to matching the frequency of the load circuit and power supply as described hereinabove, it is desirable to provide an impedance match in the load circuit. In the embodiment shown this capability is present as a result of the variable ratio winding transformer, and test circuit C advantageously enables obtaining the most desirable impedance match once the frequency match has been made. In this respect, as graphically illustrated in FIG. 3, the taps on primary winding 80 of transformer T can be changed and, in response thereto, for example, voltages $V_1$, $V_2$ and $V_3$ will be observed from voltmeter 98. The voltmeter can be appropriately calibrated to indicate a voltage V corresponding to the optimum impedance match for the number of capacitors in the circuit as a result of the frequency matching operation. By comparing voltages $V_1$, $V_2$ and $V_3$ with voltage V, the turn ratio providing the most desirable impedance match can readily be determined.

In connection with a specific example of the present invention as herein described, the test circuit oscillator is a 5 watt, 50 volt oscillator, and resistance 96 is 100 Ohms. This test circuit is adapted to assist in the matching of induction heating loads to solid state power supplies having an output frequency in the range between 1 to 10 kHz. As mentioned hereinabove, the oscillator output frequency has a range extending both above and below the rated output frequency of the power supply. Preferably, adjustable capacitor 94 is a calibrated variable capacitor which will provide for an output frequency above and below the rated output frequency of a power source having a given frequency within the above 1 to 10 kHz range. For example, if the power supply has a rated frequency of 1 kHz the variable capacitor provides an oscillator output frequency of from about 0.7 kHz to about 1.5 kHz. As a further example, if the power supply has a rated output of 3 kHz, the variable capacitor preferably provides an oscillator output frequency of from between 1 kHz to 4 kHz. As yet a further example, if the power supply has an output rating of 10 kHz, then the variable capacitor preferably provides an oscillator output frequency of from 7 kHz to 12 kHz.

With reference to the "rated output frequency" of the solid state power supply, it will be appreciated that there are limits above and below such a rating which are acceptable for operation of the power supply. These limits define a frequency range within which the solid state power supply will operate, and it is to be clearly understood that such an acceptable range is to be interpreted to be included in the terminology "rated output frequency" as the latter is referred to herein and in the appended claims.

While the present invention has been described in conjunction with a specific solid state power supply, load circuit and test circuit arrangements, it will be appreciated that the arrangement shown, or portions thereof, can readily be modified without departing from the principles of the present invention. In this respect, any suitable solid state power supply for induction heating equipment can be employed, and load circuit arrangements other than the disclosed arrangement can be employed in conjunction therewith. Likewise, an arrangement other than the double pole switch herein disclosed can be employed to selectively connect the test circuit to the load circuit independent of the power supply. Still further, modifications of the test circuit components will readily be apparent to those skilled in the art from the foregoing disclosure. Accordingly, it is to be distinctly understood that the descriptive matter herein is to be interpreted merely as illustrative of the present invention and not as a limitation.

What is claimed is:

1. An auxiliary electrical test circuit for induction heating apparatus including a load circuit comprising inductor means and power factor correction means, and a solid state power supply circuit having an output connected to said load circuit and having a rated output frequency, said power supply circuit being inoperable to deliver any power through said output to said load circuit when the resonant frequency of said load circuit when loaded is outside said rated output frequency of said power supply circuit, said test circuit including audio frequency oscillator means having an output frequency adjustable between lower and upper limits respectively below and above said rated output frequency of said power supply circuit, means for selectively coupling said test circuit with said load circuit independent of said power supply circuit, said inductor means being adapted to be inductively coupled with a workpiece, and means responsive to adjustments of said output frequency of said oscillator means for indicating an oscillator output frequency corresponding to the resonant frequency of said load circuit with a workpiece inductively coupled with said inductor means whereby said resonant frequency of said load circuit with said workpiece inductively coupled therewith can be matched with said rated output frequency of said power supply circuit prior to connecting said power supply circuit output with said load circuit.

2. The test circuit according to claim 1, wherein said means for selectively coupling said test circuit and load circuit includes switch means for disabling said solid state power supply circuit when said test circuit is coupled with said load circuit.

3. The test circuit according to claim 2, wherein said switch means is a double pole switch operable alternately to couple one of said solid state power supply and said test circuit with said load circuit and to disconnect the other from said load circuit.

4. The test circuit according to claim 1, wherein said audio frequency oscillator means includes adjustable capacitor means for adjusting the output frequency thereof.

5. The test circuit according to claim 1, wherein said solid state power supply has a rated output frequency of 1 to 10 kHz and said oscillator means has an output frequency range of from about 0.7 kHz to about 12 kHz.

6. The test circuit according to claim 1, wherein said means responsive to adjustments of said oscillator means is a voltmeter connected across the output of said oscillator means.

7. A method of matching the resonant frequency of a load circuit of induction heating equipment with the rated output frequency of a solid state power supply for the load circuit, the load circuit comprising inductor means and adjustable power factor correction means, and said power supply circuit being inoperable to deliver any power through said output to said load circuit when the resonant frequency of said load circuit when loaded is outside said rated output frequency of said power supply circuit, the method comprising the steps of disconnecting said power supply and load circuit, positioning a workpiece in inductively coupled relationship with said inductor means, coupling the output of an adjustable audio frequency oscillator with said load circuit, adjusting the output frequency of said oscillator to coincide with the resonant frequency of said load circuit, comparing said resonant frequency with said rated frequency for said power source, and adjusting said power factor correction means to match said resonant frequency and said rated frequency.

8. The method according to claim 7, and measuring the voltage across the output of said oscillator during adjusting of the output frequency thereof, and determining coincidence between said resonant frequency and an output frequency of said oscillator by the peak voltage measured.

9. The method according to claim 8, wherein said load circuit includes variable ratio transformer means having a primary winding connected to said power source and a secondary winding connected to said inductor means, and measuring the voltages for different turn ratios to determine the turn ratio providing the most desirable impedance match.

* * * * *